United States Patent
Ishii et al.

(10) Patent No.: US 9,474,172 B2
(45) Date of Patent: Oct. 18, 2016

(54) VENTILATION MEMBER AND VENTILATION STRUCTURE

(71) Applicant: NITTO DENKO CORPORATION, Ibaraki-shi, Osaka (JP)

(72) Inventors: Kyoko Ishii, Osaka (JP); Youzou Yano, Osaka (JP); Kouji Furuuchi, Osaka (JP)

(73) Assignee: Nitto Denko Corporation, Osaka (JP)

( * ) Notice: Subject to any disclaimer, the term of this patent is extended or adjusted under 35 U.S.C. 154(b) by 396 days.

(21) Appl. No.: 14/173,459

(22) Filed: Feb. 5, 2014

(65) Prior Publication Data

US 2014/0227960 A1    Aug. 14, 2014

(30) Foreign Application Priority Data

Feb. 8, 2013  (JP) .................................. 2013-023129

(51) Int. Cl.
*H05K 5/02* (2006.01)

(52) U.S. Cl.
CPC .................................. *H05K 5/0213* (2013.01)

(58) Field of Classification Search
CPC ...... H05K 5/0213; F21V 31/03; F21S 48/33; F21S 48/332; F21S 48/335
USPC ................. 454/254, 275, 284, 305
See application file for complete search history.

(56) References Cited

U.S. PATENT DOCUMENTS 6,994,621 B2   2/2006   Mashiko et al.
7,357,709 B2 * 4/2008   Zukor ................... F16K 24/04
                                                          454/270
8,475,575 B2   7/2013   Ono et al.
2009/0267252 A1 * 10/2009  Ikeyama ........... B29C 45/14336
                                                          264/40.1

FOREIGN PATENT DOCUMENTS

| JP | 2004-047425 | 2/2004 |
| JP | 2010-062094 | 3/2010 |
| JP | 2010-247547 | 11/2010 |
| WO | 2010/053121 | 5/2010 |

* cited by examiner

*Primary Examiner* — Gregory Huson
*Assistant Examiner* — Dana Tighe
(74) *Attorney, Agent, or Firm* — Hamre, Schumann, Mueller & Larson, P.C.

(57) ABSTRACT

A ventilation member includes: a first metal body including a flat portion having a first through-hole formed therein; an air-permeable membrane having a first principal surface and a second principal surface and placed on the flat portion of the first metal body so that the first principal surface covers the first through-hole; a second metal body including a flat portion having formed therein a second through-hole separated from the first through-hole by the air-permeable membrane, the second metal body being placed on a second principal surface side of the air-permeable membrane so that passage of air is permitted between the first through-hole and the second through-hole through the air-permeable membrane; and a joint portion fixing the first metal body and the second metal body to each other. The air-permeable membrane has a portion located outwardly of an outer end of the flat portion of the first metal body and an outer end of the flat portion of the second metal body.

8 Claims, 4 Drawing Sheets

VENTILATION MEMBER AND VENTILATION STRUCTURE

BACKGROUND OF THE INVENTION

1. Field of the Invention

The present invention relates to a ventilation member and a ventilation structure.

2. Description of Related Art

Air-permeable membranes need to be attached to housings for ECU boxes, electrical double layer capacitors, aluminum electrolytic capacitors, etc. to control the internal pressures of the housings. An example of a technique for attaching an air-permeable membrane to a housing is to weld the air-permeable membrane to the housing. However, this technique can only be applied to housings made of thermoplastic resins. In addition, this technique may cause damage of air-permeable membranes during welding.

In the case where a housing is made of a thermosetting resin unsuitable for welding, for example, a technique of bonding an air-permeable membrane to the housing with a double-sided adhesive tape is used. A technique of attaching a snap-fit part to the housing is also used, as disclosed in JP 2004-047425 A, for example. However, the former technique may cause the double-sided adhesive tape to peel off from the housing, which raises concerns about safety. The latter technique has a drawback in that the shape of the housing needs to be conformed to the snap-fit part.

JP 2010-062094 A and JP 2010-247547 A propose ventilation members in which air-permeable membranes are less susceptible to deformation when the ventilation members are attached to housings. In each of these ventilation members, two metal bodies serving as support bodies are used and the metal bodies are fixed to each other so as to sandwich an air-permeable membrane therebetween. Ventilation members having this configuration require neither welding nor bonding of air-permeable membranes to support bodies, and can also be attached to housings made of thermosetting resins by insert molding. However, the ventilation members having this configuration require further improvements to suppress the deformation of the air-permeable membranes when the ventilation members are attached to the housings and further to increase the reliability by being firmly connected to the housings.

SUMMARY OF THE INVENTION

It is an object of the present invention to provide a highly reliable ventilation member that can be firmly connected to a housing while suppressing deformation of an air-permeable membrane when the ventilation member is attached to the housing and that can be attached to any housing regardless of its shape and material. It is another object of the present invention to provide a ventilation structure including such a ventilation member and a housing.

The present invention provides a ventilation member including: a first metal body including a flat portion having a first through-hole formed therein; an air-permeable membrane having a first principal surface and a second principal surface and placed on the flat portion of the first metal body so that the first principal surface covers the first through-hole; a second metal body including a flat portion having formed therein a second through-hole separated from the first through-hole by the air-permeable membrane, the second metal body being placed on a second principal surface side of the air-permeable membrane so that passage of air is permitted between the first through-hole and the second through-hole through the air-permeable membrane; and a joint portion including a structure in which a projection of the second metal body is fitted in a recess of the first metal body, the joint portion fixing the first metal body and the second metal body to each other with the air-permeable membrane held between the first metal body and the second metal body. In this ventilation member, the air-permeable membrane has a portion located outwardly of an outer end of the flat portion of the first metal body and an outer end of the flat portion of the second metal body.

The present invention further provides a ventilation structure including: a resin housing having an interior space that requires ventilation and an opening for ventilation between the interior space of the housing and an exterior thereof, and the above-described ventilation member integrally jointed to the resin housing by insert molding and attached to the opening.

In the ventilation membrane of the present invention, the air-permeable membrane is held between the first metal body and the second metal body. Each of the metal bodies has higher rigidity than conventional resin support bodies. Therefore, the ventilation member of the present invention contributes to the prevention of deformation of the air-permeable membrane when the ventilation member is attached to an article such as a housing. In addition, in the ventilation member of the present invention, the air-permeable membrane has a portion located outwardly of the outer ends of the flat portions of the metal bodies. Therefore, when the ventilation member of the present invention is attached to the housing, not only the connection between the surfaces of the metal bodies and the housing but also the connection between the portion of the air-permeable membrane extending outwardly beyond the outer ends of the metal bodies and the housing contributes to the connection between the ventilation member and the housing. As a result, the ventilation member is firmly connected to the housing. In addition, since the ventilation member itself is connected to the housing, the movement of the air-permeable membrane between the metal bodies is suppressed, and as a result, the deformation of the air-permeable membrane is further suppressed. Furthermore, the ventilation member of the present invention can also be attached to housings made of thermosetting resins by, for example, insert molding. In addition, the ventilation member can be adapted to housings of various shapes.

As described above, according to the present invention, it is possible to provide a highly reliable ventilation member that can be firmly connected to a housing while suppressing deformation of an air-permeable membrane when the ventilation member is attached to the housing and that can be attached to any housing regardless of its shape and material.

The ventilation structure of the present invention includes the ventilation member of the present invention having the above-described effects. Therefore, according to the present invention, it is possible to provide a highly reliable ventilation structure that can be used for a wide variety of housings and thus can be applied to various applications.

DETAILED DESCRIPTION OF THE INVENTION

Hereinafter, embodiments of the present invention are described with reference to the accompanying drawings.

First Embodiment

Figure 1:
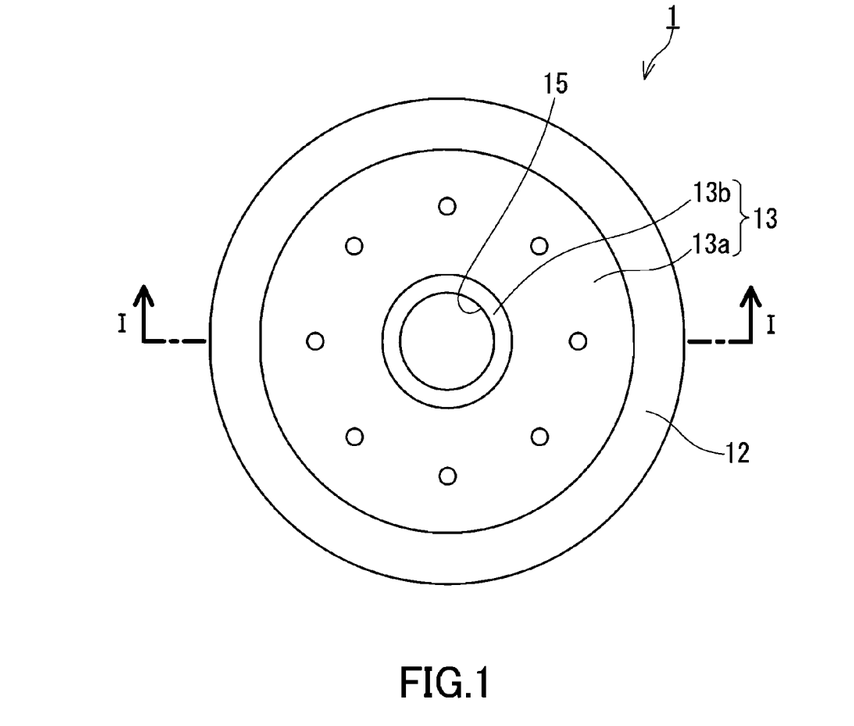
FIG. 1 is a plan view of a ventilation member according to a first embodiment of the present invention.
Figure 2:
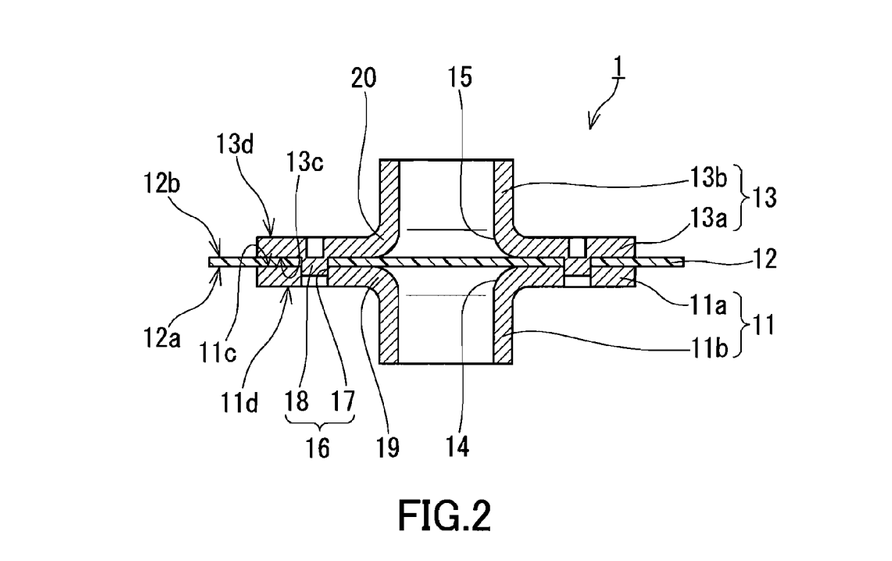
FIG. 2 is a cross-sectional view of the ventilation member shown in FIG. 1, taken along the line I-I in FIG. 1.

As shown in FIG. 1 and FIG. 2, a ventilation member 1 of the present embodiment includes a first metal body 11, an air-permeable membrane 12, and a second metal body 13.

The first metal body 11 has a disk-shaped flat portion 11a having a through-hole 14 (first through-hole). The flat portion 11a of the first metal body 11 has a first principal surface 11c facing the air-permeable membrane 12 and a second principal surface 11d opposite to the first principal surface 11c, and the first metal body 11 further has a protruding portion 11b provided in the periphery of the through-hole 14 on the second principal surface 11d and protruding from the second principal surface 11d. In the present embodiment, this protruding portion 11b is formed integrally with the flat portion 11a along the periphery of the through-hole 14 on the second principal surface 11d and extends in a direction protruding from the periphery on the second principal surface 11d.

The second metal body 13 also has a disk-shaped flat portion 13a having a through-hole 15 (second through-hole). The flat portion 13a of the second metal body 13 also has a first principal surface 13c facing the air-permeable membrane 12 and a second principal surface 13d opposite to the first principal surface 13c, and the second metal body 13 further has a protruding portion 13b provided in the periphery of the through-hole 15 on the second principal surface 13d and protruding from the second principal surface 13d. In the present embodiment, this protruding portion 13b is formed integrally with the flat portion 13a along the periphery of the through-hole 15 on the second principal surface 13d and extends in a direction protruding from the periphery on the second principal surface 13d.

Figure 3:
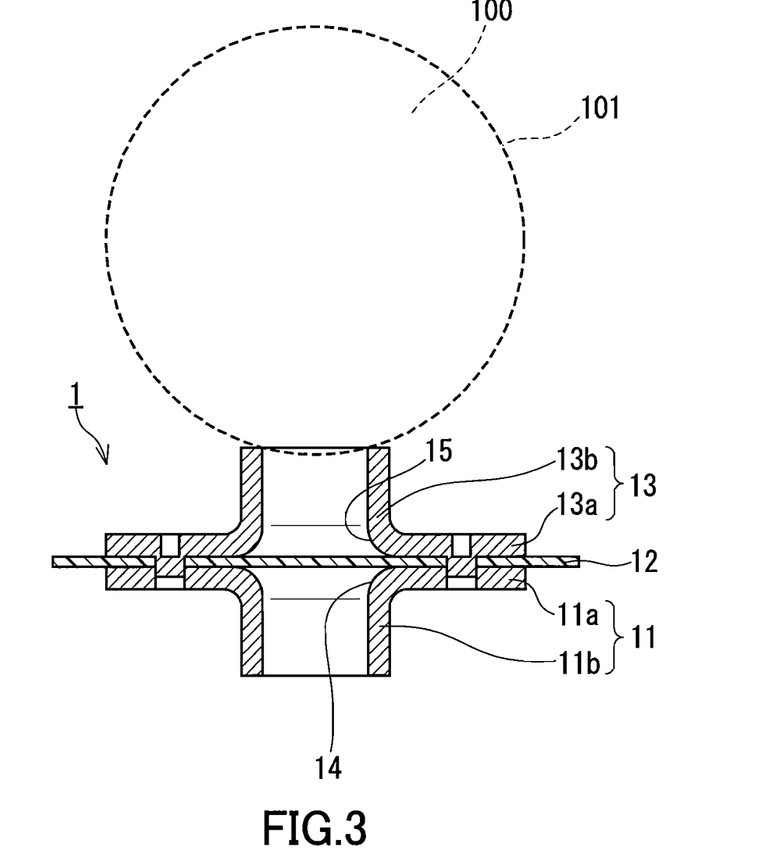
FIG. 3 is an explanatory diagram showing an example of how the ventilation member shown in FIG. 1 is in contact with another ventilation member.

With the protruding portions 11b and 13b, the air-permeable membrane 12 located inside the through-holes 14 and 15 can be protected. For example, when a plurality of ventilation members 1 are packed in a box, the ventilation members 1 are in a disorderly state in the box. In that case, when one ventilation member 1 is located near another ventilation member 1, there is a risk that a part of the another ventilation member 1 may come into the through-hole 14 or 15 of the one ventilation member 1 and contact the air-permeable membrane 12 inside the through-hole 14 or 15 of the one ventilation member 1. However, in the case of the ventilation members 1 of the present embodiment, for example, as shown in FIG. 3, even if the outer end portion 101 of the metal body of another ventilation member 100 having the same shape as the ventilation member 1 is located in contact with the through-hole 14 or 15 of the ventilation member 1, the protruding portion 11b or 13b serving as a protective barrier protects the air-permeable membrane 12 located inside the through-hole 14 or 15 from contact with the outer end portion 101 of the another ventilation member 100. This facilitates packing of the ventilation members 1. In addition, the protruding portions 11b and 13b also have the effect of facilitating handling of the ventilation member 1 in the step of insert-molding the ventilation member 1 and a resin, for example.

The air-permeable membrane 12 is held between the first metal body 11 and the second metal body 13. The through-hole 14 and the through-hole 15 are separated from each other by the air-permeable membrane 12. Passage of air is permitted between the through-hole 14 and the through-hole 15 through the air-permeable membrane 12. The outer end of the air-permeable membrane 12 is located outwardly of the outer end of the flat portion 11a of the first metal body 11 and the outer end of the flat portion 13a of the second metal body 13.

In this ventilation member 1, the outer end of the air-permeable membrane 12 extends outwardly beyond the outer end of the flat portion 11a of the first metal body 11 and the outer end of the flat portion 13a of the second metal body 13. This makes it easy to ensure that the air-permeable membrane 12 is fixed between the first metal body 11 and the second metal body 13. In addition, in this ventilation member 1, in the case where a resin component covering the outer end portions of the flat portion 11a of the first metal body 11, the air-permeable membrane 12, and the flat portion 13a of the second metal body 13 is further provided in the ventilation member 1 by insert molding or in the case where the ventilation member 1 is integrally joined to a resin housing by insert molding, not only the metal bodies 11 and 13 but also the portion of the air-permeable membrane 12 extending outwardly beyond the outer ends of the metal body 11 and the metal body 13 are inserted into the resin. As a result, the ventilation member 1 and the resin are joined together more firmly, and thus the reliability of the ventilation member 1 is increased. Furthermore, since the air-permeable membrane 12 itself is connected and fixed to the resin, the deformation of the air-permeable membrane 12 is also suppressed. The configuration as in the ventilation member 1 of the present embodiment, in which the entire outer end of the air-permeable membrane 12 is located outwardly of the outer end of the flat portion 11a of the first metal body 11 and the outer end of the flat portion 13a of the metal body 13, is desirable because the configuration ensures the effects described above. However, even if in a ventilation member, the outer end of the air-permeable membrane 12 includes a portion located on the outer ends of the flat portion 11a of the first metal body 11 and the flat portion 13a of the second metal body 13 or located inwardly of the outer ends thereof, the ventilation member can have the effects described above.

The outer end of the air-permeable membrane is located, desirably 1 mm or more, more desirably 2 mm or more, outwardly of the outer end of the flat portion 11a of the first metal body 11 and the outer end of the flat portion 13a of the second metal body 13. This makes it easier to ensure that the air-permeable membrane 12 is fixed between the first metal body 11 and the second metal body 13. In addition, in the case where the above-described resin component is provided in the ventilation member 1 by insert molding or in the case where the ventilation member 1 is integrally joined to the resin housing by insert molding, the ventilation member 1 and the resin are joined together more firmly and thus the reliability of the ventilation member 1 is further increased.

The outer end of the air-permeable membrane 12 is located, desirably 5 mm or less, more desirably 4 mm or less, outwardly of the outer end of the flat portion 11a of the first metal body 11 and the outer end of the flat portion 13a of the second metal body 13. This reduces the risk of damage to the outer end of the air-permeable membrane 12 during transport. In addition, this prevents the portion of the air-permeable membrane 12 extending outwardly beyond the outer ends of the metal bodies 11 and 13 from being bent to cover the through-hole when the ventilation member 1 is installed in the housing, and thus makes it easy to handle the ventilation member 1.

As shown in FIG. 2, the first metal body 11 and the second metal body 13 are fixed to each other by a joint portion 16, with the air-permeable membrane 12 held therebetween. Thereby, the gap between the metal bodies 11 and 13 and the air-permeable membrane 12 is sealed. Specifically, the first metal body 11 has a recess 17 (recessed hole) formed therein. The second metal body 13 has a projection 18 (projecting dowel) formed thereon. The joint portion 16 includes a fitting structure of these recess 17 and projection 18. Two or more recesses 17 are formed around the through-hole 14 and two or more projections 18 are formed around the through-hole 15 so that two or more joint portions 16 are formed around the through-holes 14 and 15 at regular intervals.

The ventilation member 1 including these joint portions 16 does not require bonding or welding of the air-permeable membrane 12 to the first metal body 11 and/or the second metal body 13. However, a portion of the air-permeable membrane 12 may be bonded or welded to the first metal body 11 or the second metal body 13. If the air-permeable membrane 12 is temporarily bonded by adhesion or the like, it is easy to align the first metal body 11, the air-permeable membrane 12, and the second metal body 13 when they are assembled.

The joint portion 16 can be a caulking joint using expansion and contraction of metals. As a technique for joining metal plates together with the caulking joint, V-shaped caulking, round caulking, round and V-shaped caulking, etc. are known, but any of these can be used in the present invention. The number of the joint portions 16 is not particularly limited, and can be selected as appropriate within a range of 3 to 8, for example. The shape of the joint portion 16 in plan view, that is, the shape of the recess 17 and the projection 18 is typically circular. The diameter of the joint portion 16, that is, the diameter of the recess 17 and the projection 18 also is not particularly limited, and can be selected as appropriate within a range of 0.5 to 2 mm, for example. The projecting length in the joint portion 16 (projecting length of the dowel) also is not particularly limited, and can be selected as appropriate within a range of 0.25 to 1 mm. In view of the strength of the joint portion 16, the projecting length in the joint portion 16 may be greater than the thickness of the air-permeable membrane 12.

In FIG. 2, the projections 18 are fitted in the recesses 17 without the air-permeable membrane 12 interposed therebetween. That is, the joint portions 16 penetrate the air-permeable membrane 12. This configuration makes the air-permeable membrane 12 less likely to slip from between the first metal body 11 and the second metal body 13 even if a high pressure is applied to the air-permeable membrane 12, resulting in an increase in the reliability of the ventilation member 1. The air-permeable membrane 2 may be interposed between the recesses 17 and the projections 18. That is, in some cases, the projections 18 are fitted directly in the recesses 17. In other cases, the projections 18 are fitted in the recesses 17 with the air-permeable membrane 12 interposed therebetween. This difference comes from the difference in the production method of the ventilation member 1. Typically, the ventilation member 1 can be produced by the following procedure. First, the first metal body 11, the air-permeable membrane 12, and the second metal body 13 are stacked to form a stack. The entire stack is pressed in the thickness direction thereof to form the joint portions 16. When this method is used, the air-permeable membrane 12 can be interposed between the recesses 17 and the projections 18. Since there is no need to keep the air-permeable membrane 12 from being pressed together when the stack is pressed, it is very easy to assemble the ventilation member 1. On the other hand, if holes are previously formed in the air-permeable membrane 12 and the ventilation member 1 is assembled so that the joint portions 16 are provided at the positions corresponding to the holes, a configuration in which the air-permeable membrane 12 is not interposed between the recesses 17 and the projections 18 can be obtained.

A corner portion 19 formed by the first principal surface 11c of the first metal body 11 and the inner wall surface of the through-hole 14 has a rounded shape. A corner portion 20 formed by the first principal surface 13c of the second metal body 13 and the inner wall surface of the through-hole 15 also has a rounded shape. This rounded shape of the corner portions 19 and 20 prevents the air-permeable membrane 12 from being damaged by the corner portions 19 and 20. In particular, in the step of insert-molding the ventilation member 1 with a resin, when the ventilation member 1 is placed in a mold and the resin contracts, the metal bodies 11 and 13 are pressed against each other in a direction to press the air-permeable membrane 12. In this case, the air-permeable membrane 12 in contact with the corner portions 19 and 20 is susceptible to damage. However, since the corner portions 19 and 20 are rounded in the present embodiment, the air-permeable membrane 12 is less susceptible to damage from the metal bodies 11 and 13. The shape of the corner portions 19 and 20 is not limited to a rounded shape and may be a chamfered shape because they only need to have such a shape that the metal bodies 11 and 13 cause less damage to the air-permeable membrane 12 when they press the air-permeable membrane 12.

In the present embodiment, the ventilation member 1 has a symmetric shape with respect to the plane formed by the air-permeable membrane 12. This means that in the present embodiment, the first metal body 11 has the same dimensions (the same diameter and thickness) as the second metal body 13, and the first metal body 11 and the second metal body 13 are the same components before assembly. The use of common components for both the first metal body 11 and the second metal body 13 reduces the number of different components and is advantageous in terms of cost reduction. The flat portions 11a and 13a of the metal bodies 11 and 13 have a thickness of, for example, 0.25 to 1 mm, to facilitate the formation of the joint portion 16.

As the material of the metal bodies 11 and 13, versatile metals such as stainless steel, cast iron, carbon steel, and aluminum can be used. It is desirable to use an antioxidant surface-treated material or an oxidation resistant material. The metal bodies 11 and 13 can be produced by common processing/molding methods such as pressing, cutting, raising, and die casting.

The air-permeable membrane 12 has a first principal surface 12a and a second principal surface 12b. The air-permeable membrane 12 is placed between the first metal body 11 and the second metal body 13 so that the first principal surface 12a covers the through-hole 14 and the second principal surface 12b covers the through-hole 15.

Figure 4:
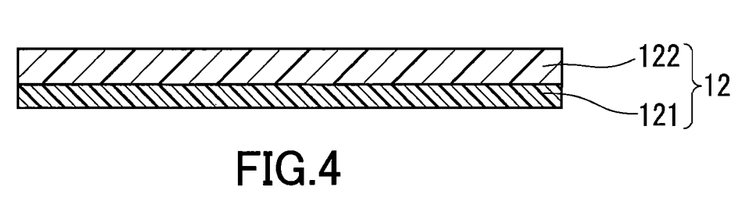
FIG. 4 is a cross-sectional view of an air-permeable membrane.

The structure and material of the air-permeable membrane 12 are not particularly limited and any membrane can be used as long as it has the properties of allowing gases to pass through and preventing liquids from entering. As shown in FIG. 4, the air-permeable membrane 12 may have a membrane body 121 and a reinforcing member 122 laminated on the membrane body 121. The lamination of the reinforcing member 122 increases the strength of the air-permeable membrane 12. It should be understood that the air-permeable membrane 12 may consist only of the membrane body 121.

The membrane body 121 may be subjected to an oil-repellent treatment or a water-repellent treatment. These liquid-repellent treatments can be performed by applying a material having a low surface tension to the membrane body 121, followed by drying and then curing the material. Any liquid-repellent agent can be used as long as a coating film having a lower surface tension than that of the membrane body 121 can be formed using the agent. For example, a liquid-repellent agent containing a polymer having a perfluoroalkyl group can be suitably used. The liquid-repellent agent is applied to the membrane body 121 by a known method such as impregnation or spraying.

A typical example of the membrane body 121 is a porous membrane made of a fluorine resin or a polyolefin. From the viewpoint of ensuring sufficient waterproofness, a resin porous membrane having an average pore diameter of 0.01 to 10 μm can be used as the membrane body 121.

Examples of the fluorine resin that can be suitably used for the membrane body 121 include polytetrafluoroethylene (PTFE), polychlorotrifluoroethylene, tetrafluoroethylene-hexafluoropropylene copolymer, and tetrafluoroethylene-ethylene copolymer. Examples of the polyolefin that can be suitably used for the membrane body 121 include polymers of monomers such as ethylene, propylene, and 4-methyl-pentene-1,1 butene, and copolymers of these monomers. A porous nanofiber film material containing polyacrylonitrile, nylon, or polylactic acid may be used. In particular, PTFE is preferred because it not only exhibits high air permeability even with a small area but also has an excellent ability to prevent foreign substances from entering the inside of the housing. Porous PTFE membranes can be produced by a known molding method such as stretching or extraction.

The reinforcing member 122 can be a member made of a resin such as polyester, polyethylene, or aramid. The form of the reinforcing member 122 is not particularly limited as long as the air permeability of the air-permeable membrane 12 can be maintained. For example, the reinforcing member 122 is made of a woven fabric, a nonwoven fabric, a net, a mesh, a sponge, a foam, or a porous material. The membrane body 121 may be laminated to the reinforcing member 122 by heat lamination, heat welding, or ultrasonic welding, or with an adhesive. A silicone rubber sheet also can be used as the reinforcing member 122. The use of a silicone rubber sheet as the reinforcing member 122 increases the strength of the air-permeable membrane 12.

In one preferred example, the air-permeable membrane 12 consists only of the membrane body 121 and the membrane body 121 is made of a PTFE membrane. Since the PTFE membrane commonly used as the air-permeable membrane 12 is thin and flexible, it can provide sufficient strength (connection strength) to the joint portion 16 even if the air-permeable membrane 12 is interposed between the recesses 17 and the projections 18. The air-permeable membrane 12 may be ruptured at the joint portion 16, but the rupture has no significant influence on the performance of the ventilation member 1.

In another preferred example, the air-permeable membrane 12 has a layered structure of the membrane body 121 and the reinforcing member 122, the membrane body 121 is made of a porous PTFE membrane, and the reinforcing member 122 is made of a silicone rubber sheet. When the air-permeable membrane 12 configured as such is used, it is desirable to place the air-permeable membrane 12 in a position suitable for a housing to which the ventilation member 1 is to be attached. For example, in the case where a chemical or a solvent is present inside the housing, it is desirable to attach the ventilation member 1 to the housing so that the surface of the air-permeable membrane on which the highly chemical-resistant PTFE membrane is exposed faces the inside of the housing and the silicone rubber sheet is exposed to the outside of the housing (the atmosphere).

The thickness of the air-permeable membrane 12 is suitably in the range of 1 μm to 5 mm, in view of the strength and ease of handling. The air permeability of the air-permeable membrane 12 is suitably in the range of 0.1 to 300 $sec/100 \ cm^3$ in terms of Gurley number obtained by the Gurley test method specified in JIS P 8117. The water entry pressure of the air-permeable membrane 12 is suitably 1.0 kPa or more.

The ventilation member 1 may further be provided with a resin component covering the outer end portions of the first metal body 11, the air-permeable membrane 12, and the second metal body 13, although not shown in the drawings. The resin component is typically made of an elastomer. A thermoplastic elastomer is preferably used as such an elastomer. Specifically, "MILASTOMER (registered trademark)" available from Mitsui Chemicals, Inc., "MIRA-PRENE (registered trademark)" available from Mitsubishi Chemical Corporation, or the like can be suitably used. The resin component is integrally joined to the first metal body 11, the air-permeable membrane 12, and the second metal body 13 by insert molding. That is, the ventilation member 1 is inserted into a mold to form the resin component. The air-permeable membrane 12 has a portion extending outwardly beyond the outer ends of the flat portions 11a and 13a of the metal bodies 11 and 13. Therefore, not only the metal bodies 11 and 13 but also the portion of the air-permeable membrane 12 extending outwardly beyond the outer ends of the metal bodies 11 and 13 is inserted into the resin component. In addition, when the resin contracts during the insert molding, forces pressing the air-permeable membrane 12 are applied to the metal bodies 11 and 13. As a result, the first metal body 11 and the second metal body 13 are joined together more firmly.

Not only the above-mentioned elastomers but also thermosetting resins such as EPDM (ethylene propylene diene monomer), silicone resin, and butyl rubber can also be used for the above-mentioned resin component.

Second Embodiment

Figure 5:
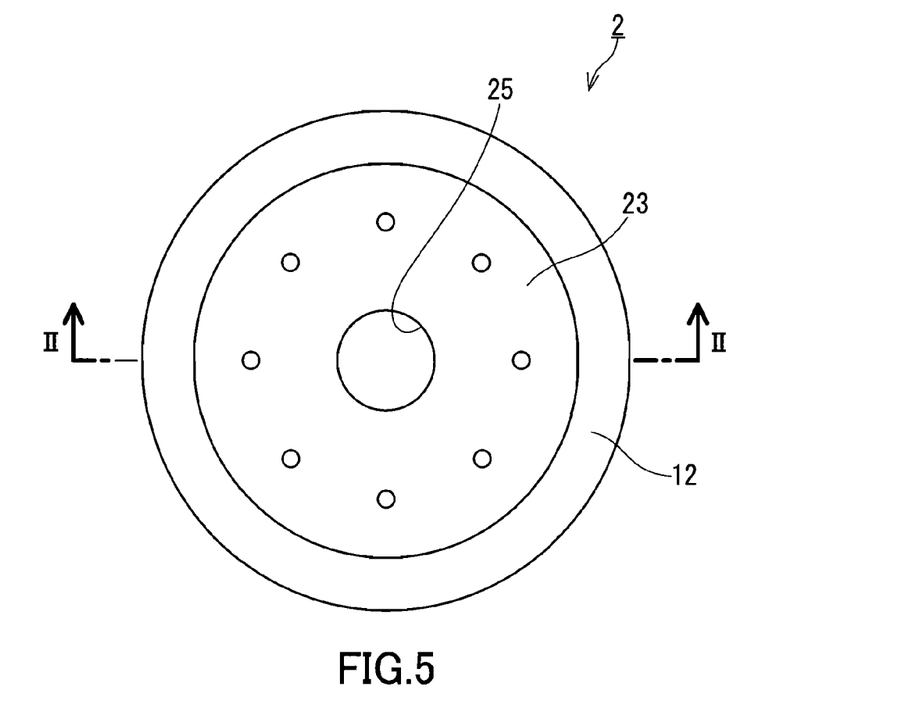
FIG. 5 is a plan view of a ventilation member according to a second embodiment of the present invention.
Figure 6:
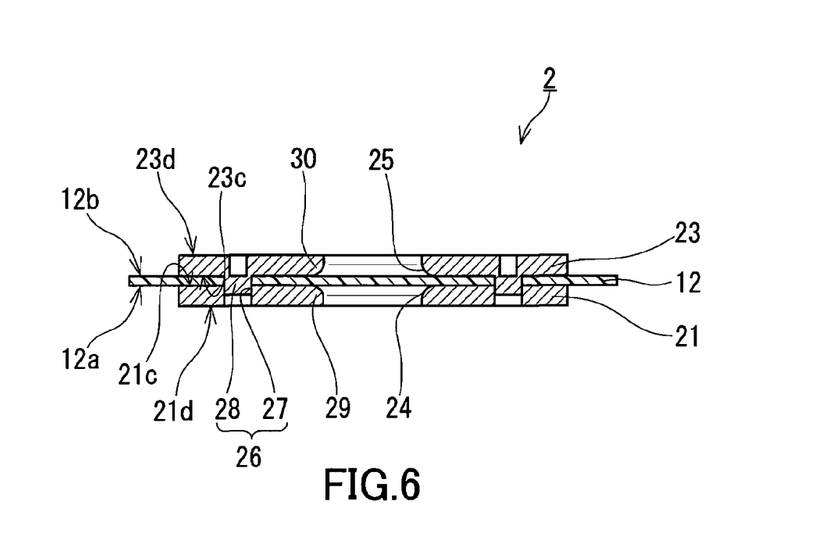
FIG. 6 is a cross-sectional view of the ventilation member shown in FIG. 5, taken along the line II-II in FIG. 5.

As shown in FIG. 5 and FIG. 6, a ventilation member 2 of the present embodiment includes a first metal body 21, the air-permeable membrane 12, and a second metal body 23. The air-permeable membrane 12 is the same as that of the first embodiment. The difference between the present embodiment and the first embodiment lies in the structure of the first metal body 21 and the second metal body 23, and more specifically in the structure for protecting the air-permeable membrane 12.

The first metal body 21 is formed of a disk-shaped flat portion having a through-hole 24 (first through-hole), and the second metal body 23 is formed of a disk-shaped flat portion having a through-hole 25 (second through-hole). The air-permeable membrane 12 is held between the first metal body 21 and the second metal body 23. The through-hole 24 and the through-hole 25 are separated from each other by the air-permeable membrane 12. Passage of air is permitted between the through-hole 24 and the through-hole 25 through the air-permeable membrane 12. The outer end of the air-permeable membrane 12 is located outwardly of the outer ends of the first metal body 21 and the second metal body 23. The effects obtained by the air-permeable membrane 12 whose outer end is located outwardly of the outer ends of the metal bodies 21 and 23 and the desirable form of this air-permeable membrane 12 are as described in the first embodiment.

Figure 7:
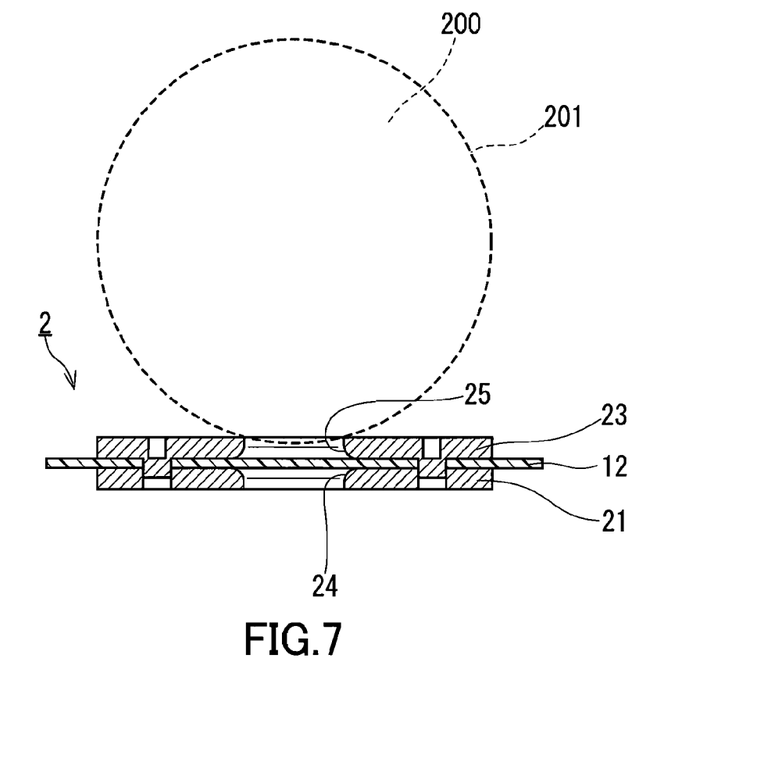
FIG. 7 is an explanatory diagram showing an example of how the ventilation member shown in FIG. 5 is in contact with another ventilation member.

The first metal body 21 has a first principal surface 21c facing the air-permeable membrane 12 and a second principal surface 21d opposite to the first principal surface 21c, and the first metal body 21 has, on the second principal surface 21d, a membrane protection structure provided in the periphery of the through-hole 24 to protect the air-permeable membrane 12 located inside the through-hole 24. In the present embodiment, this structure is given by the shape of the periphery of the through-hole 24 on the second principal surface 21d side of the first metal body 21. The second metal body 23 has a first principal surface 23c facing the air-permeable membrane 12 and a second principal surface 23d opposite to the first principal surface 23c, and the second metal body 23 has, on the second principal surface 23d, a membrane protection structure provided in the periphery of the through-hole 25 to protect the air-permeable membrane 12 located inside the through-hole 25. In the present embodiment, this structure is given by the shape of the periphery of the through-hole 25 on the second principal surface 23d side of the second metal body 23. Specifically, for example, as shown in FIG. 7, the shape and dimensions of the through-hole 24 on the second principal surface 21d side and those of the through-hole 25 on the second principal surface 23d side are determined based on the outer diameters of the metal bodies 21 and 23 and distances from the second principal surface 21d and the second principal surface 23d to the air permeable membrane 12 so as to prevent the outer end portion 201 of the metal body of another ventilation member 200 having the same shape as the ventilation member 2 from contacting the air-permeable membrane 12 inside the through-hole 24 or 25 when the outer end portion 201 of the another ventilation member 200 comes into contact with the through-hole 24 or 25.

As shown in FIG. 6, the first metal body 21 and the second metal body 23 are fixed to each other by a joint portion 26, with the air-permeable membrane 12 held therebetween. The structure of the joint portion 26 is the same as that of the joint portion 16 of the first embodiment (see FIG. 2), and a recess 27 and a projection 28 correspond to the recess 17 and the projection 18 of the first embodiment, respectively. Therefore, the description of the joint portion 26 is omitted herein.

A corner portion 29 formed by the first principal surface 21c of the first metal body 21 and the inner wall surface of the through-hole 24 has a rounded shape. A corner portion 30 formed by the first principal surface 23c of the second metal body 23 and the inner wall surface of the through-hole 25 also has a rounded shape. The effects obtained by the corner portions 29 and 30 having this shape are the same as those obtained by the corner portions 19 and 20 of the first embodiment. The corner portions 29 and 30 may have a chamfered shape.

In the present embodiment, the ventilation member 2 has a symmetric shape with respect to the plane formed by the air-permeable membrane 12. This means that in the present embodiment, the first metal body 21 has the same dimensions (the same diameter and thickness) as the second metal body 23, and the first metal body 21 and the second metal body 23 are the same components before assembly. The use of common components for both the first metal body 21 and the second metal body 23 reduces the number of different components and is advantageous in terms of cost reduction. The metal bodies 21 and 23 have a thickness of, for example, 0.25 to 1 mm, to facilitate the formation of the joint portion 26.

The material of the metal bodies 21 and 23 and the production method thereof are the same as those of the metal bodies 11 and 13 of the first embodiment.

As in the ventilation member 1 of the first embodiment, the ventilation member 2 of the present embodiment may also further be provided with a resin component covering the outer end portions of the first metal body 21, the air-permeable membrane 12, and the second metal body 23.

Third Embodiment

Figure 8:
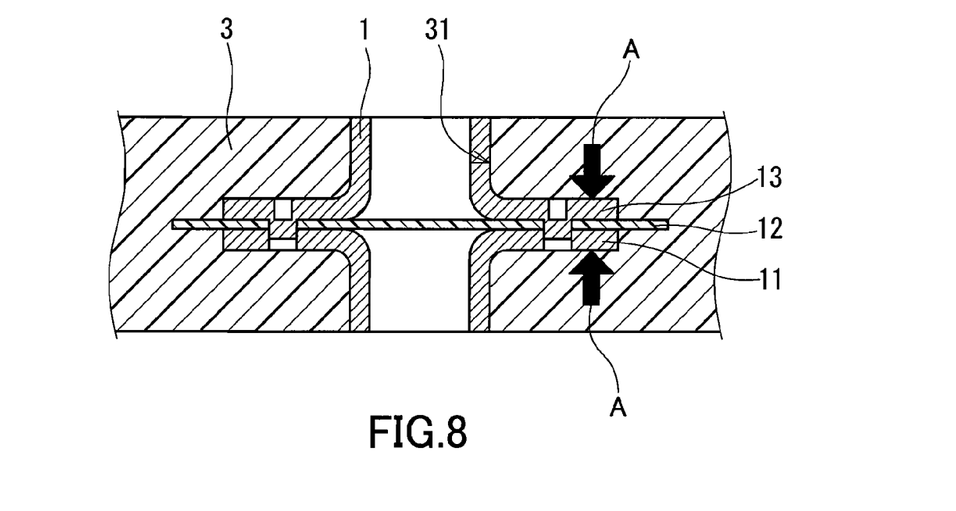
FIG. 8 is a cross-sectional view of a ventilation structure according to a third embodiment of the present invention.

FIG. 8 shows a ventilation structure in which the ventilation member 1 and the resin housing 3 of the first embodiment are integrally joined together. The resin housing 3 has an interior space that requires ventilation and an opening 31 for ventilation between the interior space of the housing and an exterior thereof. The ventilation member 1 is integrally joined to the resin housing 3 by insert molding, and thus the ventilation member 1 is attached to the opening 31 of the resin housing 3. That is, the ventilation member 1 is inserted into a mold to form the resin housing 3. The air-permeable membrane 12 has a portion extending outwardly beyond the outer ends of the flat portions 11a and 13a of the metal bodies 11 and 13. Therefore, not only the metal bodies 11 and 13 but also the portion of the air-permeable membrane 12 extending outwardly beyond the outer ends of the metal bodies 11 and 13 is inserted into the resin housing 3. In addition, when the resin contracts during the insert molding, forces A pressing the air-permeable membrane 12 are applied to the metal bodies 11 and 13. Therefore, the first metal body 11 and the second metal body 13 are joined together more firmly. As a result, a highly reliable ventilation structure in which the ventilation member 1 and the resin housing 3 are firmly joined together is obtained.

In the ventilation structure of the present embodiment, the ventilation member 1 of the first embodiment is used, but the ventilation member 2 of the second embodiment may be used.

The ventilation member of the present invention can be used for housings for ECU boxes, electrical double layer capacitors, aluminum electrolytic capacitors, etc. The ventilation member of the present invention can also be used for housings made of, for example, thermosetting resins. That is, the ventilation member of the present invention can be used for any housing regardless of its shape and material.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A ventilation member comprising:
   a first metal body including a flat portion having a first through-hole formed therein;
   an air-permeable membrane having a first principal surface and a second principal surface and placed on the flat portion of the first metal body so that the first principal surface covers the first through-hole;
   a second metal body including a flat portion having formed therein a second through-hole separated from the first through-hole by the air-permeable membrane, the second metal body being placed on a second principal surface side of the air-permeable membrane so that passage of air is permitted between the first through-hole and the second through-hole through the air-permeable membrane; and
   a joint portion including a structure in which a projection of the second metal body is fitted in a recess of the first metal body, the joint portion fixing the first metal body and the second metal body to each other with the air-permeable membrane held between the first metal body and the second metal body,
   wherein the air-permeable membrane has a portion located outwardly of an outer end of the flat portion of the first metal body and an outer end of the flat portion of the second metal body,
   the flat portion of the first metal body has a first principal surface facing the air-permeable membrane and a second principal surface opposite to the first principal surface, and the first metal body has, on the second principal surface, a membrane protection structure provided in a periphery of the first through-hole to protect the air-permeable membrane located inside the first through-hole, and
   the flat portion of the second metal body has a first principal surface facing the air-permeable membrane and a second principal surface opposite to the first principal surface, and the second metal body has, on the second principal surface, a membrane protection structure provided in a periphery of the second through-hole to protect the air-permeable membrane located inside the second through-hole,
   the flat portion of the first metal body and the flat portion of the second metal body have a disk shape,
   in the first metal body, the membrane protection structure is given by a shape of the periphery of the first through-hole on the second principal surface side of the first metal body, the shape being determined based on outer diameters of the flat portions of the first and second metal bodies and a distance from the second principal surface of the first metal body to the air permeable membrane so as to prevent another ventilation member having the same shape as the ventilation member from contacting the air-permeable membrane of the ventilation member when said another ventilation member comes into contact with the first through-hole of the ventilation member, and
   in the second metal body, the membrane protection structure is given by a shape of the periphery of the second through-hole on the second principal surface side of the second metal body, the shape being determined based on the outer diameters of the flat portions of the first and second metal bodies and a distance from the second principal surface of the second metal body to the air permeable membrane so as to prevent another ventilation member having the same shape as the ventilation member from contacting the air-permeable membrane of the ventilation member when said another ventilation member comes into contact with the second through-hole of the ventilation member.

2. The ventilation member according to claim 1, wherein an outer end of the air-permeable membrane is located outwardly of the outer end of the flat portion of the first metal body and the outer end of the flat portion of the second metal body.

3. The ventilation member according to claim 1, wherein the projection is fitted in the recess without the air-permeable membrane interposed therebetween.

4. The ventilation member according to claim 1, wherein
   the membrane protection structure of the first metal body is a protruding portion provided in the periphery of the first through-hole on the second principal surface of the first metal body and protruding from the second principal surface, and
   the membrane protection structure of the second metal body is a protruding portion provided in the periphery of the second through-hole on the second principal surface of the second metal body and protruding from the second principal surface.

5. The ventilation member according to claim 1, wherein the ventilation member has a symmetric shape with respect to a plane formed by the air-permeable membrane.

6. The ventilation member according to claim 1, further comprising a resin component covering outer end portions of the first metal body, the air-permeable membrane, and the second metal body,
   wherein the resin component is integrally joined to the first metal body, the air-permeable membrane, and the second metal body by insert molding.

7. The ventilation member according to claim 1, wherein
   the first metal body includes a corner portion formed by a first principal surface of the flat portion of the first metal body and an inner wall surface of the first through-hole, the first principal surface facing the air-permeable membrane, and the corner portion having a rounded shape or a chamfered shape, and
   the second metal body includes a corner portion formed by a first principal surface of the flat portion of the second metal body and an inner wall surface of the second through-hole, the first principal surface facing the air-permeable membrane, and the corner portion having a rounded shape or a chamfered shape.

8. A ventilation structure comprising:
   a resin housing having an interior space that requires ventilation and an opening for ventilation between the interior space of the housing and an exterior thereof; and
   the ventilation member according to claim 1 integrally jointed to the resin housing by insert molding and attached to the opening.

* * * * *